United States Patent

Ha et al.

[11] Patent Number: 5,983,191
[45] Date of Patent: Nov. 9, 1999

[54] METHOD AND APPARATUS FOR AUTOMATICALLY COMPENSATING TONE COLOR

[75] Inventors: Yeong Ho Ha; Kyu Pill Han, both of Daeku; Kwang Choon Lee; Sung Kyu Jeon, both of Kumi, all of Rep. of Korea

[73] Assignee: LG Electronics Inc., Seoul, Rep. of Korea

[21] Appl. No.: 09/094,493

[22] Filed: Jun. 10, 1998

[30] Foreign Application Priority Data

Jun. 11, 1997 [KR] Rep. of Korea ............... 97-24020

[51] Int. Cl.[6] .................................................. G10L 9/00
[52] U.S. Cl. ........................... 704/500; 84/659; 84/600
[58] Field of Search ............................. 704/500; 84/600, 84/607, 608, 616, 623, 627, 684, 653, 659

*Primary Examiner*—Susan Wieland
*Assistant Examiner*—Marquita Jones
*Attorney, Agent, or Firm*—Finnegan, Henderson, Farabow, Garrett, & Dunner, L.L.P.

[57] ABSTRACT

A method and apparatus for automatically compensating a tone color. The method includes a first step for determining whether a channel is modified or an input audio signal is switched, a second step for calculating frequency characteristics of the input audio signal and comparing the compared result with data in a basic table, a third step for determining the input audio signal as a least error mode during the second step, and a fourth step for compensating a tone color in accordance with the determined mode. The method and apparatus automatically adjusts a tone color by determining a present tone color in itself on the ground of the frequency energy being presently applied when a channel is modified, an input audio signal is switched, or a color sound mode is modified, thereby eliminating a manual manipulation by a user as well as providing an optimal sound.

7 Claims, 6 Drawing Sheets

FREQUENCY VARIATION (MAX 20kHz)

FIG. 3B

CONVERSION TO TIME AXIS

| MODE / PROPERTIES | VOICE | | | | | MUSIC | | | | | MIXED (SPORT BROADCASTING) | | | | |
|---|---|---|---|---|---|---|---|---|---|---|---|---|---|---|---|
| BAND1(63) | CA | C8 | D5 | B8 | D7 | 9D | CE | AA | D9 | | | | D4 | D8 | C0 |
| BAND2(160) | AF | 8F | | C7 | 8C | | | D5 | 9A | 7A | | | D4 | D8 | |
| BAND3(400) | B4 | | C8 | C6 | 61 | | | | | AF | | | BB | | |
| BAND4(1k) | D2 | D4 | B3 | BD | DA | | | 73 | | | | | | | |
| BAND5(2.5k) | | B6 | CF | 9B | DA | | | BE | B3 | | | | | | |
| BAND6(6.3k) | B1 | D7 | CA | B8 | AD | | C6 | BE | B1 | | | 69 | AE | 90 | B7 | C1 | D4 |
| BAND7(16k) | D2 | A1 | 96 | B4 | AE | BC | | | | | | | DE | | CB | |
| NUMBER OF VOICELESS BANDS | 2E | 2A | 27 | 1C | 1B | | 5 | 21 | 21 | 3 | 3 | 2 | 2 | 1 | |
| NUMBER OF ENERGY BANDS | 6 | 6 | 7 | 6 | 7 | 2 | 2 | 5 | 5 | 4 | 2 | 2 | 2 | 2 | 2 |
| ENTIRE VARIATIONS | 16 | 17 | E | F | 15 | 7 | 5 | E | A | B | 8 | 8 | A | 5 | 5 |
| VARIATIONS ADJACENT TO 1KHz BANDS | 4 | 8 | 6 | 6 | 6 | 6 | 8 | 5 | 5 | | | | | | |

FIG. 4B

| MODE / PROPERTIES | CLASSIC | | | | | JAZZ | | | | | POP | | | | |
|---|---|---|---|---|---|---|---|---|---|---|---|---|---|---|---|
| BAND1(63) | DF | 9A | D6 | | | BA | A2 | DA | | | CE | CB | | 86 | D6 |
| BAND2(160) | B1 | 80 | B4 | | 87 | | 94 | B2 | 95 | CE | | | | AB | |
| BAND3(400) | B5 | 9F | A4 | | | | | | | | | | | | |
| BAND4(1k) | DC | B9 | | CB | | AC | BC | | BC | | | | AA | | |
| BAND5(2.5k) | A6 | | D9 | D8 | | 89 | | AA | DD | A7 | | | | | 93 |
| BAND6(6.3k) | | | DD | | | D9 | | B3 | 9A | | C6 | | | | 6C |
| BAND7(16k) | | | | DE | DF | | | C9 | D5 | 9A | | | | | |
| NUMBER OF VOICELESS BANDS | B | 3 | A | 2E | B | 4 | 6 | 6 | 2B | 14 | 1 | AB | 7 | 7 | 3 |
| NUMBER OF ENERGY BANDS | 5 | 3 | 5 | 4 | 2 | 3 | 3 | 5 | 6 | 3 | 2 | | 2 | 2 | 3 |
| ENTIRE VARIATIONS | C | 6 | A | 9 | 4 | B | 9 | 10 | 12 | 8 | 5 | 6 | 6 | 6 | 6 |
| VARIATIONS ADJACENT TO 1kHz BANDS | 8 | 4 | 6 | 6 | | 2 | 3 | 4 | 5 | 5 | | 2 | 2 | | |

METHOD AND APPARATUS FOR AUTOMATICALLY COMPENSATING TONE COLOR

BACKGROUND OF THE INVENTION

1. Field of the Invention

The present invention relates to an audio signal processing technology, and more particularly, to an improved method and apparatus for automatically compensating a tone color without an additional key manipulation by a user.

2. Description of the Background Art

Figure 1:
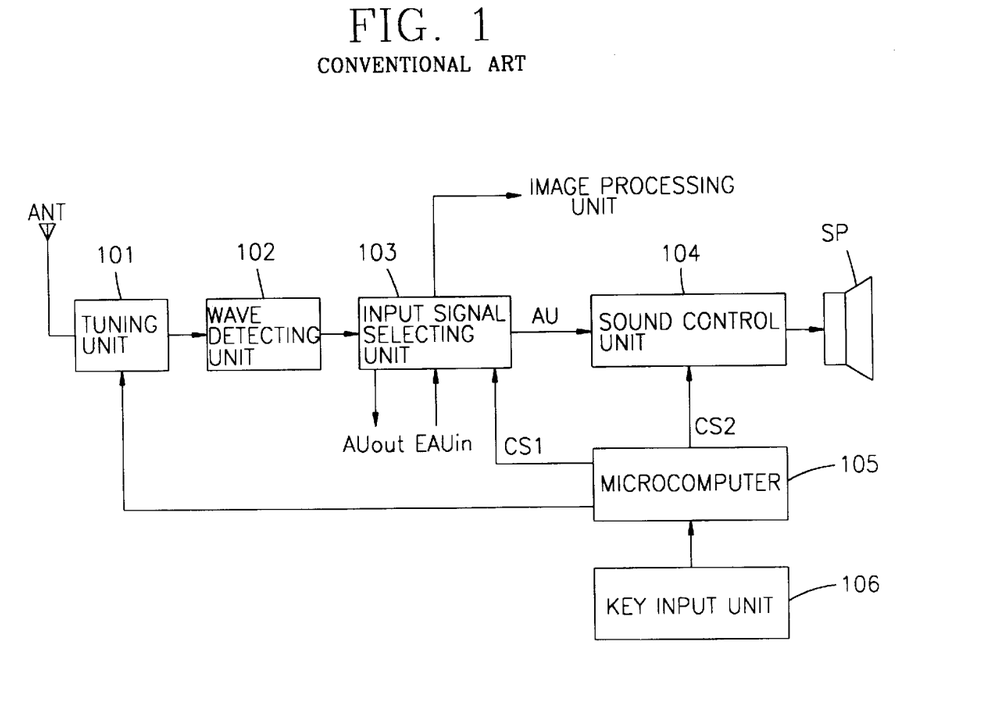
FIG. 1 is a block diagram illustrating a conventional audio signal processing apparatus for a television set.

FIG. 1 is a block diagram illustrating a conventional audio signal processing apparatus for a television set. As shown therein, the apparatus includes a tuning unit 101 for selecting a channel required by a user from a plurality of channels in accordance with high frequency broadcasting signals received through an antenna ANT, a wave detecting unit 102 for receiving an output signal of the tuning unit 101 and restoring a video signal and an audio signal, an input signal selecting unit 103 for outputting to an image processing unit the video signal received from the wave detecting unit 102 and outputting one selected from the audio signal outputted from the wave detecting unit 102 and an external audio signal $EAU_{in}$, a voice control unit 104 for adjusting a sound volume of the audio signal AU output from the input signal selection unit 103 and outputting a resultant signal to a speaker SP, and a microcomputer 105 for controlling respective blocks in accordance with a user selected signal received from a key input unit 106.

The operation of the conventional audio signal processing apparatus will now be described.

First, in case a user intends to watch an arial wave broadcasting, when a required broadcasting channel is input through the key input unit 106, the input signal is applied to the microcomputer 105 which in turn outputs the corresponding control signal to the tuning unit 101.

The tuning unit 101 selects one of a plurality of channels with high frequency broadcasting signals through the antenna ANT, that is, the channel which corresponds to the control signal applied thereto from the microcomputer 105 selected by the user, amplifies the television broadcasting signal of the corresponding channel to a predetermined level, and outputs the amplified signal. Then, the wave detecting unit 102 restores an original video signal and an audio signal from the signal outputted from the tuning unit 101.

The input signal selecting unit 103 transfers the video signal among those outputted from the wave detecting unit 102 to the image processing unit, and the audio signal AU is transferred to the voice control unit 104.

When there is required a playback of an external device through an additional connection line other than the case in which an aerial wave broadcasting is watched, that is, when peripheral devices such as a VCR, CD(compact disc) player, and LD(laser disc) player, are connected to the television set for their playback, a user may carry out the key operation of a corresponding function through the key input unit 106, and the microcomputer 105 recognizes the key operation to thereby apply a control signal CS1 corresponding thereto to the input signal selecting unit 103.

Then, the input signal selection unit 103 selects one from the audio signal or external audio signal $EAU_{in}$ outputted from the wave detecting unit 102 in accordance with the control signal CS1, and outputs the video signal and audio signal to the image processing unit and the voice control unit 104, respectively. The voice control unit 104 receives the audio signal AU outputted from the input signal selecting unit 103, and adjusts the received signal to a volume level required by the user, that is, a volume level in correspondence to the control signal CS2 outputted from the microcomputer 105 so as to be applied to the speaker SP.

However, the tone color adjusting technology of the conventional audio signal processing apparatus has a disadvantage in that a tone color compensation for respective frequencies is carried out using a preset value when selecting a tone color mode desired by a user after setting a compensation value in accordance with several tone color modes, thereby causing an inconvenience in use.

For example, when a user intends to listen to music while listening to news, the voice mode has to be manually converted to a music mode. That is, if there is no key input, the tone color is maintained without change.

Also, the tone color compensation is performed under the reference of average characteristics of respective major modes, so that different frequency characteristics have caused unnatural feelings. That is, such a tone color compensation has been stuck under a uniformed tone color.

SUMMARY OF THE INVENTION

The present invention is directed to solution of the conventional disadvantages. Accordingly, it is an object of the present invention to provide a method and apparatus for automatically compensating a tone color, wherein a tone color mode of an audio signal is automatically determined to adjust a tone color, and a varied value within the mode is appropriately adjusted in accordance with energy of respective frequencies of a presently applied audio signal so as to prevent an unnatural feeling from occurring to a user when frequency characteristics are considerably different even in same tone color mode.

To achieve the above described object, there is provided a method for automatically compensating a tone color according to the present invention which includes a first step for determining whether a channel is modified or an input audio signal is switched, a second step for calculating frequency characteristics of the input audio signal and comparing the compared result with data in a basic table, a third step for determining the input audio signal as a least error mode during the second step, and a fourth step for compensating a tone color in accordance with the determined mode.

Further, to achieve the above described object, there is provided an apparatus for automatically compensating a tone color in a device for receiving an external input or an aerial wave and playing back an audio signal according to the present which includes an automatic tone color determining unit for analyzing characteristics depending upon time-oriented frequency types, a microcomputer for determining a tone color mode using tone color determining information outputted from the automatic tone color determining unit and outputting a tone color compensating control signal so as to compensate the tone color to a corresponding mode thereof, and a voice control unit for compensating a tone color in accordance with the tone color compensating control signal.

The object and advantages of the present invention will become more readily apparent from the detailed description given hereinafter. However, it should be understood that the detailed description and specific example, while indicating a preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 2:
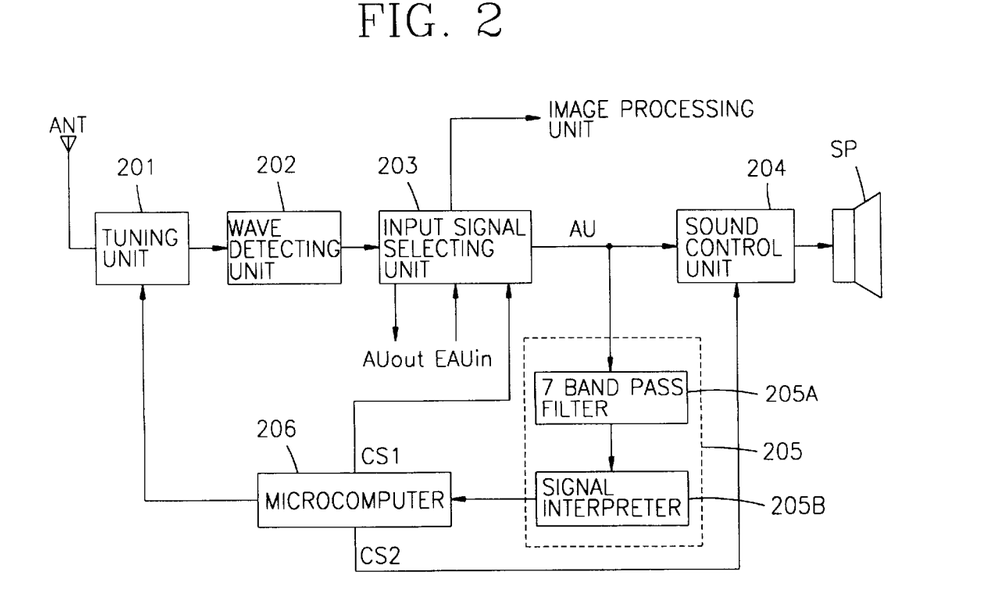
FIG. 2 is a block diagram illustrating an audio signal processing apparatus for a television which is applicable to an apparatus for automatically compensating a tone color according to the present invention.

FIG. 2 is a block diagram illustrating an audio signal processing apparatus for a television set according to a preferred embodiment of the present invention. As shown therein, the apparatus includes: a tuning unit 201 for selecting a channel required by a user from a plurality of channels in accordance with high frequency broadcasting signals received through an antenna ANT; a wave detecting unit 202 for receiving an output signal of the tuning unit 201 and restoring a video signal and an audio signal; an input signal selecting unit 203 for outputting one selected from an audio signal outputted from the wave detecting unit 202 and an external audio signal $EAU_{in}$ received through an extra connection line; a voice control unit 204 for adjusting volume and voice color with regard to the audio signal AU outputted from the input signal selecting unit 203 and outputting the resultant value to a speaker SP; an 7-band pass filter 205A for classifying the frequency of the input audio signal to a plurality of bands and outputting the resulting vale; a signal interpreter 205B for accumulating an output value of the 7-band pass filter 205A therein for a predetermined time, calculating respective energy variations of the bands depending upon the frequency characteristics, comparing the compared result with data in the reference table, separating an input audio signal in the least error mode, and accordingly outputting a tone color determining information; and a microcomputer 206 for controlling a tuning operation of the tuning unit 201, an input signal selecting operation of the input signal selecting unit 203, and a volume of the voice control unit 204, and then outputting a tone color compensating control signal CS2 to control a tone color of the voice control unit 204 in accordance with the tone color determining information outputted from the signal interpreter 205B.

The operation and effects of the thusly constituted present invention will now be described with further reference to FIGS. 3 through 5.

The tuning unit 201 selects a channel required by a user, that is, a channel corresponding to a the tuning data received from the microcomputer 206, amplifies a television broadcasting signal of a corresponding channel to a predetermined level, and outputs the amplified signal.

The wave detecting unit 202 restores an original video signal and audio signal from an video and audio intermediate frequency signal outputted from the tuning unit 201.

Also, the input signal selecting unit 203 transmits an video signal outputted from the wave detecting unit 202 to an image processing unit disposed in rear thereof, and outputs one selected from the audio signal outputted from the wave detecting unit 202 and an external audio signal $EAU_{in}$. Here, such a selecting operation is carried out in accordance with a control signal CS1 outputted from the microcomputer 206.

At this time, the automatic tone color determining unit 205 analyzes a frequency characteristic of the audio signal outputted from the input signal selecting unit 203, and outputs the tone color determining data for selecting a tone color mode in accordance with the analyzed results.

Also, The microcomputer 206 determines a corresponding tone color mode in accordance with the tone color determining data outputted from the automatic tone color determining unit 205, and outputs a sound compensating control signal CS2 to control the voice control unit 204 in correspondence to the corresponding mode.

Accordingly, the voice control unit 204, when outputting the audio signal AU outputted from the input signal selecting unit 203, adjusts a tone color in accordance with the control signal CS2 for outputting. At this time, the adjusting elements are employed as they are to adjust the tone color.

According to the above steps, the tone color is automatically adjusted depending upon a frequency distribution of the input audio signal.

Here, with reference to a preferred embodiment realizing the automatic tone color determining unit 205 by the 7-band pass filter 205A and the signal interpreter 205B, a further description will now be followed.

First, the audio signal AU outputted from the input signal selecting unit 203 is filtered to 7 different frequency regions through the 7-band pass filter 205A and outputted accordingly.

Here, a multi-band pass filter is employed due to the following reasons. In order to interpret a frequency of an audio signal, a Fourier conversion may be considered. The conversion, however, requires a significant amount of calculation, thereby making it impossible to realize the conversion using a known microcomputer. In addition, a Fourier conversion-exclusive device incurs a further cost increase, so that the present invention employs a simple band pass filter to analyze frequency types of the input audio signal and determine the tone color mode accordingly.

The signal interpreter 205B sequentially accumulates therein the output value of the 7-band pass filter 205A for a predetermined time, considers respective band energy values, variations and the number of voiceless intervals, in accordance with frequency characteristics, compares the resultant value with the data in the reference table, determines the tone color mode of the input audio signal in a mode having a least error, and transfers the accordingly determined information to the microcomputer 206.

At this time, when determining the audio signal and the tone color mode, a frequency characteristic is more important than the energy magnitude in respective frequencies. Therefore, when the signal interpreter 205B determines a tone color mode of the audio signal, there does not exist an accurate reference value. The separation occurs depending upon preference ranks of the characteristics and energy patterns of the frequencies.

For example, the preferred embodiment of the present invention determines a tone color mode in consideration of output values of 7-band pass filter, the number of voiceless intervals, the number of energy bands, entire variation, and a variation adjacent to 1 kHz band.

Also, in order to facilitate the interpretation of the frequency variation with regard to time flow, the principle of spectrogram is employed.

Figure 3A:
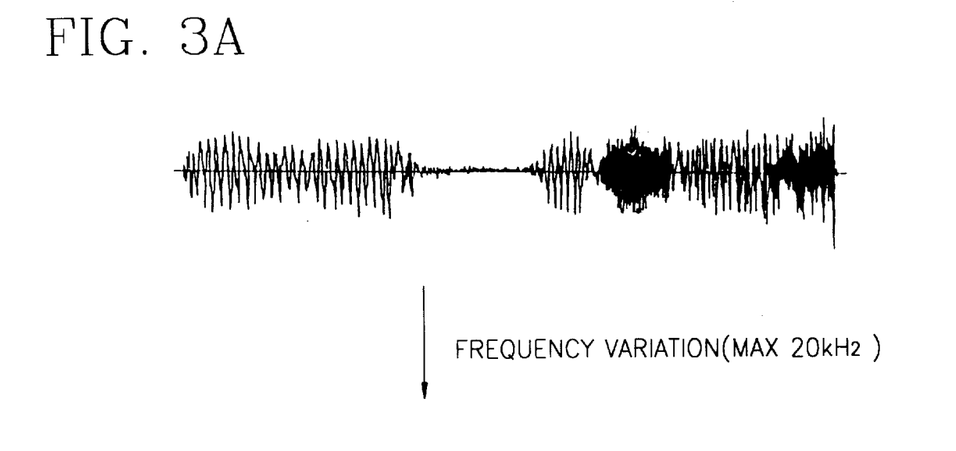
FIG. 3A is a timing diagram illustrating an audio signal under a spectrogram principle applied to the present invention.
Figure 3B:
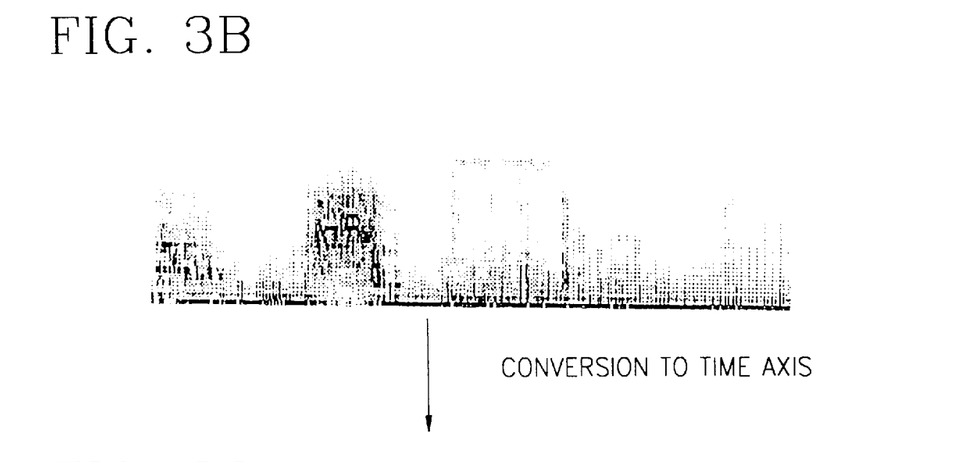
FIG. 3B is a timing diagram illustrating a frequency region of an audio signal under a spectrogram principle applied to the present invention.
Figure 3C:
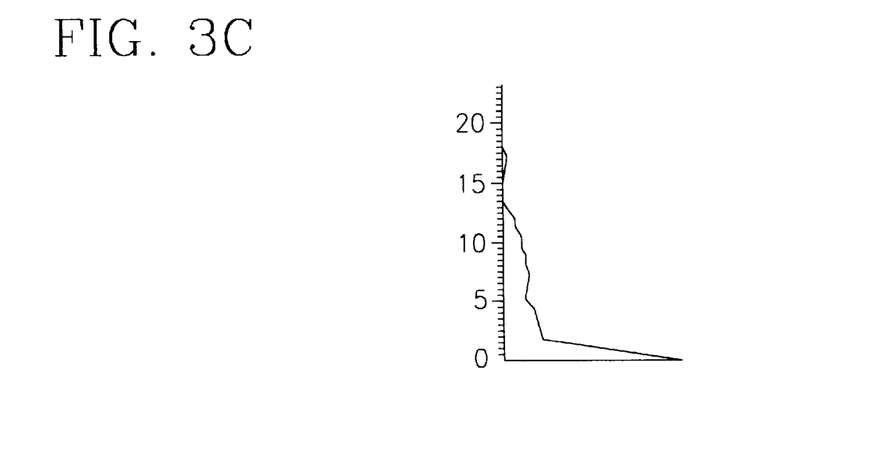
FIG. 3C is a graph illustrating an audio signal arrayed along a time axis under a spectrogram principle applied to the present invention.

The audio signal as shown in FIG. 3A is converted to a frequency region as shown in FIG. 3B for a short time so as to array along the time axis as shown in FIG. 3C to obtain a graphic image. Using a two-dimensional data obtained through the above steps, the audio signal is analyzed.

Figure 4A:
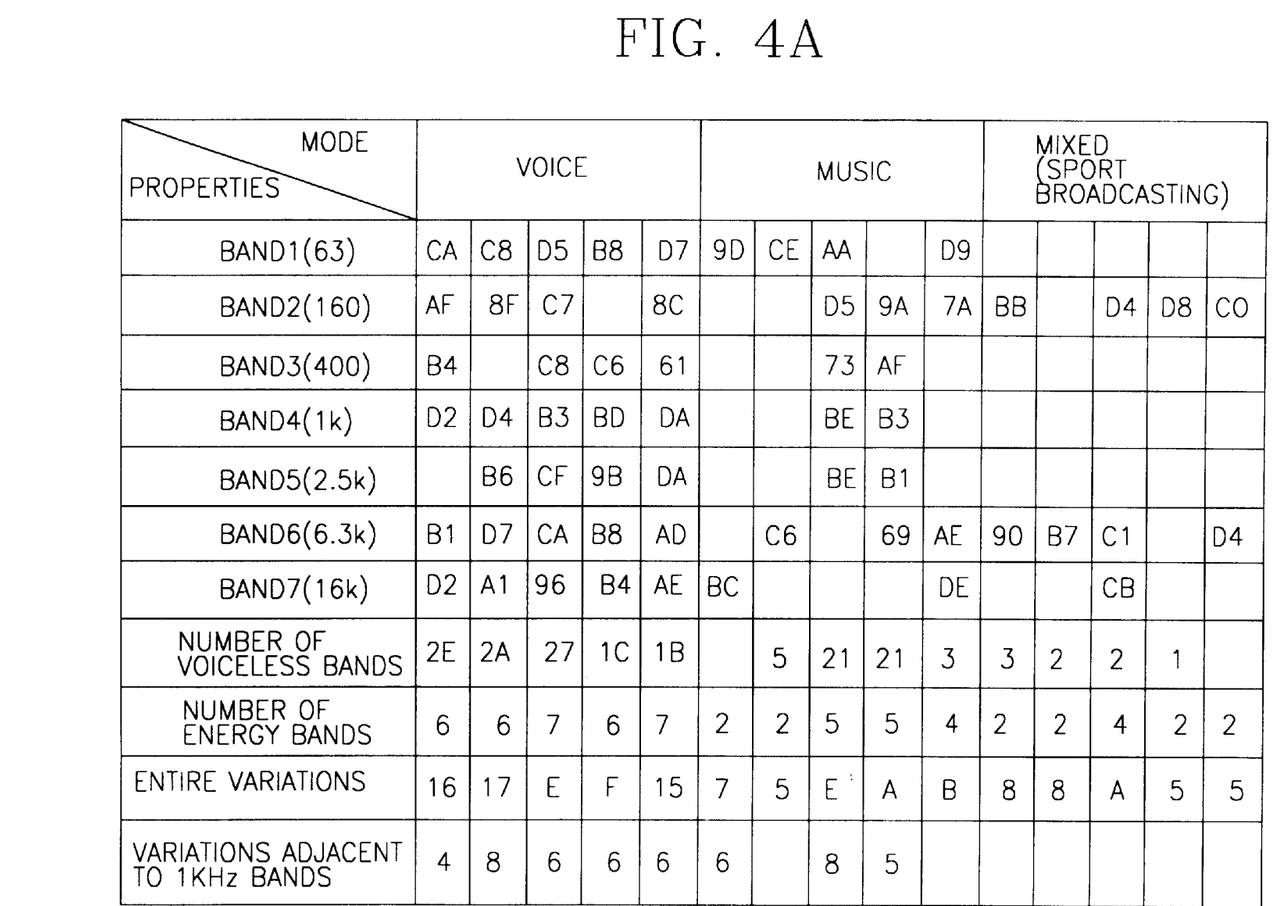
FIG. 4A is a table of frequency mode characteristics in application of a television set with regard to an automatic tone color selecting unit.
Figure 4B:
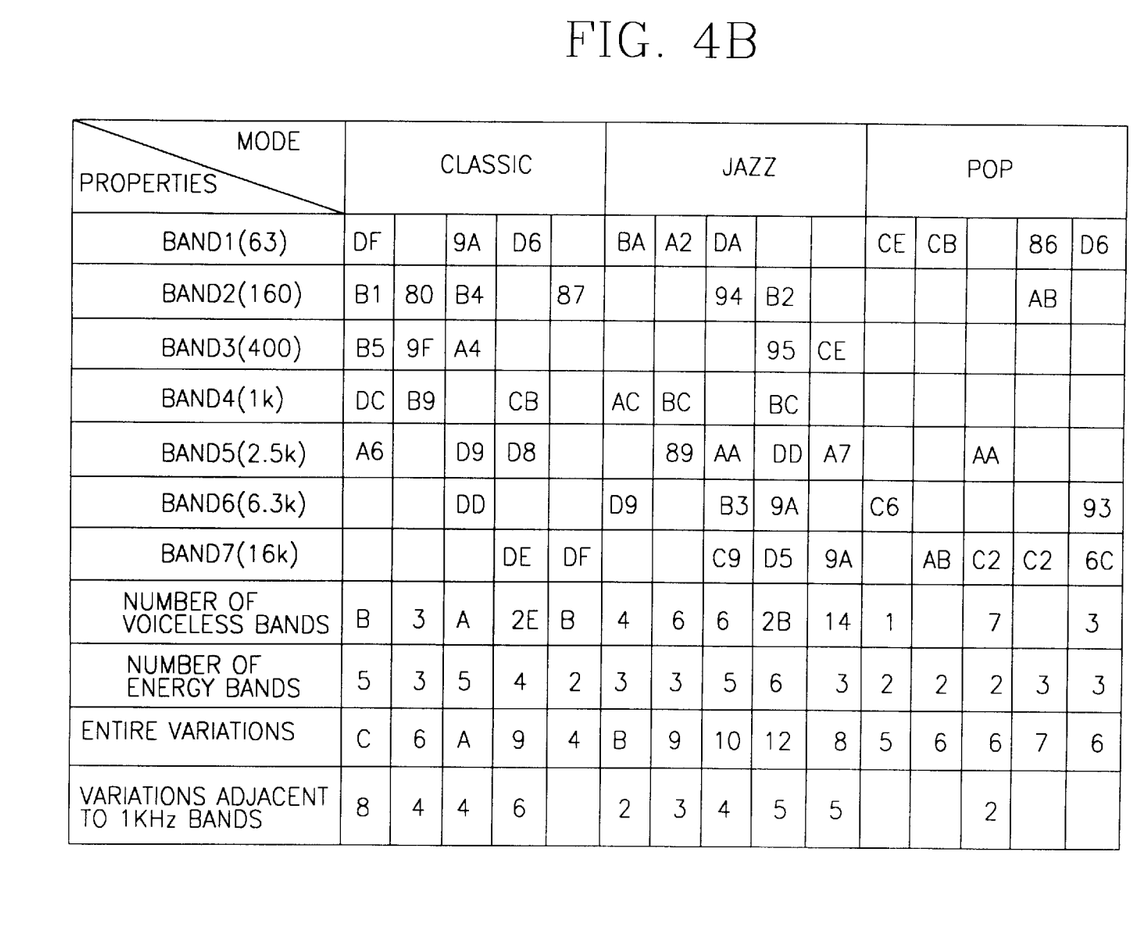
FIG. 4B is a table of frequency mode characteristics obtained by application of a CD with regard to an automatic tone color selecting unit.

FIGS. 4A and 4B are tables respectively illustrating frequency characteristics depending upon modes obtained in application of the automatic tone color determining unit 205 to TV and CD, that is, energy values and variations in frequency regions to facilitate the tone color mode determination by comparing the presently applied audio signal with the characteristic tables.

Here, the frame set employed in the determination targets 81 frames by adding 9 frames in which the filter values are obtained for 200 ms time period, and 9 frames for determining a voiced/voiceless of 15 ms within 200 ms.

The output values of respective bands with regard to the 7-band (band1~band7) pass filter 205A denote frequency energy and each has a value ranging from 00~FF(h). However, since the noise occurring in the voiceless intervals exists larger than E0 (h), the value is ignored to have a value ranging from 00~E0 (h), and the number of voiceless frames is obtained by counting the frames determined as voiceless. A maximum 81 is given within one frame set so that the value may range from 00~51 (h).

Also, the number of energy bands denotes that of the bands which do not have zero as output value, so that the value ranges from 0~7 (h), and the entire variation is generated by increasing by "1" when the energy of the 7-band pass filter changes to allow the value of the filter to be read 9 times, thereby generating maximum 8 times of variations in one filter. Accordingly, in 7 filters, there occur a maximum 56 times of variations, so that the value ranges from 00~38 (h).

The band variation near 1 kHz occurs by an increase of "1" when the energy varies in the filter of band3 to band5, so that maximum 24 times of variations are possible in 3 filters, thereby obtaining a value in 00~18 (h).

As shown in FIG. 4A, the voice signal is evenly distributed over the entire bands, and the energy is large near 1 kHz and the energy variations are large in the band. Meanwhile, a music signal is smaller than the voice signal around 1 kHz.

The mixed signal such as sport broadcasting signal has an audience cheer in a significantly high frequency. Therefore, when a narrator's voice is larger, the mixed signal is classified as voice signal depending on the intervals; otherwise, the mixed signal shows characteristics as shown in FIG. 4A.

Also, as shown in FIG. 4B, classic music and pop music are slightly separable, but in case of jazz it is difficult to discern since jazz is known as an intermediate forme between classic and pop music.

To put all the characteristics together, the signal interpreter 205B determines a mode having a least error by deciding its preference rank. Here, the most important factor in separating the voice signal and the music signal is the number of voiceless intervals.

In case of the voice signal, there exist at least more than 10 voiceless intervals among all the 81 frames. This is because the voice signal tends to be interrupted in the meantime. When there only exists voice of news, more than 95% of cognition rate has been obtained by use of such characteristics. However, when many people speak at the same time, a frequency characteristic has to be utilized due to its small voiceless interval.

Therefore, the control flow of the tone color determination should be judged on the ground of the number of the voiceless intervals, initially, and when the number is significantly large, it is instantly determined as voice signal.

The remaining signals are compared using the characteristics in FIGS. 4A and 4B and then classified according to the mode having the least error.

Here, in consideration of the number of voiceless frames as a first priority, the characteristics are classified to four steps and the modes can be finely separated depending upon the other characteristics as follows:

Firstly, number of voiceless frames>4 A(h): no input signals;

Secondly, F(h)<number of voiceless frames≦4 A(h): voice;

Thirdly, 5 (h)<number of voiceless frames≦F(h): high possibility to be classified as mixed signals;

Number of energy bands≧6: voice;

{4<number of energy bands<6} and {there exist more than two bands other than zero among bands 1, 2, 6 and 7}: mixed;

{number of energy bands<4} and {band1=0} and {band7=0}: mixed;

{number of energy bands<4} and {band≠0 or band1≠0} and {there exists less than 1 band other then zero among bands 3, 4, and 5}: music;

Fourthly, number of voiceless intervals≦5 (h): high possibility to be classified as music;

{band7=0} and {number of energy bands>5}: voice;

{band≠0} and {bands other than zero among bands 3, 4, and 5≧2}: mixed;

{band7≠0} and {bands other than zero among bands 3, 4 and 5<2} and {band1=0} and {band2=0} and {variation near 1 kHz≧4}: mixed;

{band7≠0} and {bands other than zero among bands 3, 4 and 5<2} and {band1=0} and {band2≠0} and {number of energy bands≦4}: mixed; and the remaining others: music.

The separation of classic, jazz and pop with regard to a signal classified as music mode is as follows:

First, Classic,

{band7=0} and {bands other than zero among bands 3, 4, and 5>2};

{band7=0} and {bands other than zero among bands 3, 4, and 5<2} and {band1=0} and {number of energy values≦3};

Second, Jazz,

{not classic} and {band1=0} and {band7≠0} and {number of energy bands>4};

{not classic} and {band1=0} and {band7=0} and {band6≠0} and {band5≠0};

{not classic} and {band1≠0} and {band7≠0} and {band6≠0} and {band5≠0}: jazz; and Third, pop includes all the music except for classic and jazz.

Since the modes are classified as indicated above, large error denotes a big difference in characteristic preference rank, and when the mode corresponds to the compared case in higher preference rank, the difference in lower preference rank is ignored.

Likewise, when the signal interpreter 205B selects a tone color mode having a least error with regard to the input audio signal, the selected information is applied to the microcomputer 206 which in turn sends the control signal CS2 in accordance with the selected information to the voice control unit 204.

Then, the voice control unit 204 controls the tone color of the input audio signal in accordance with the control signal CS2 and outputs the resultant value to the speaker SP.

Figure 5A:
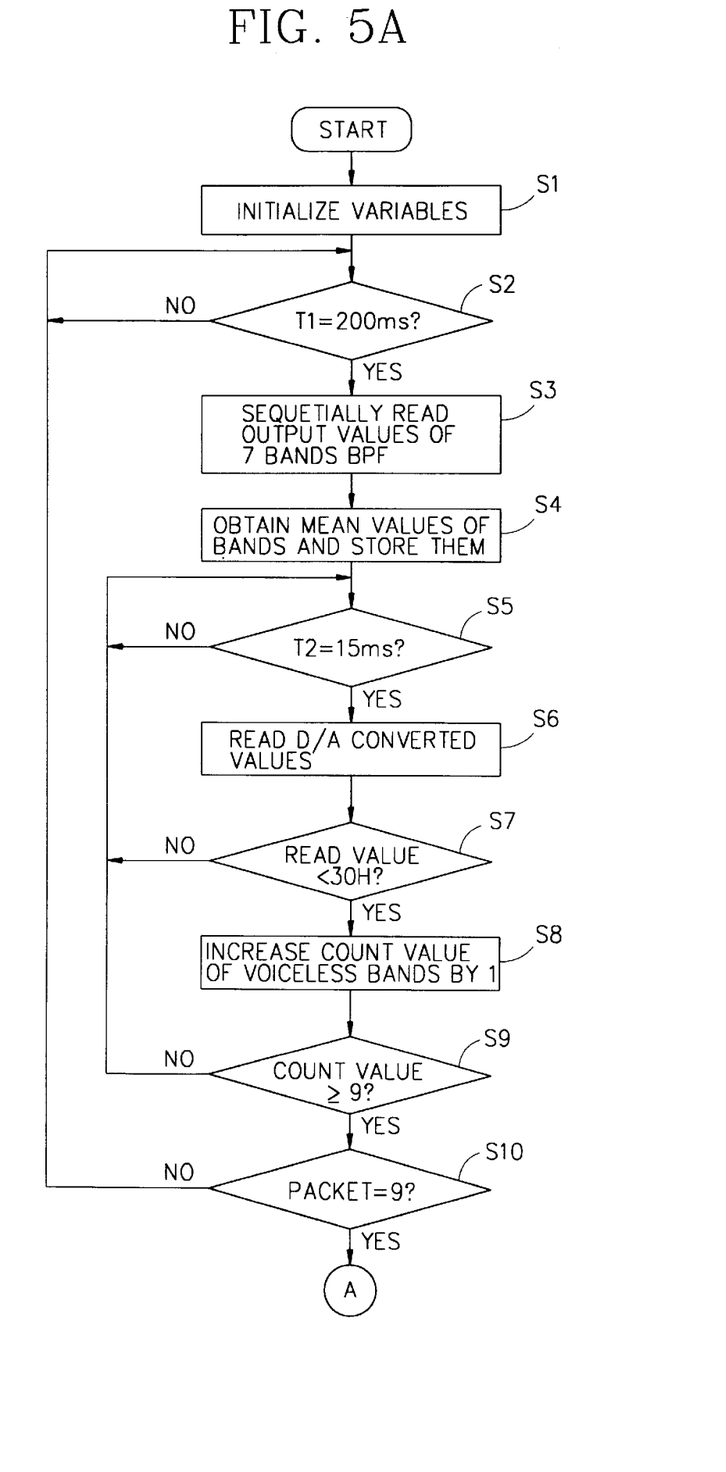
FIGS. 5A and 5B are signal flow charts illustrating a method for automatically compensating a tone color according to the present invention.
Figure 5B:
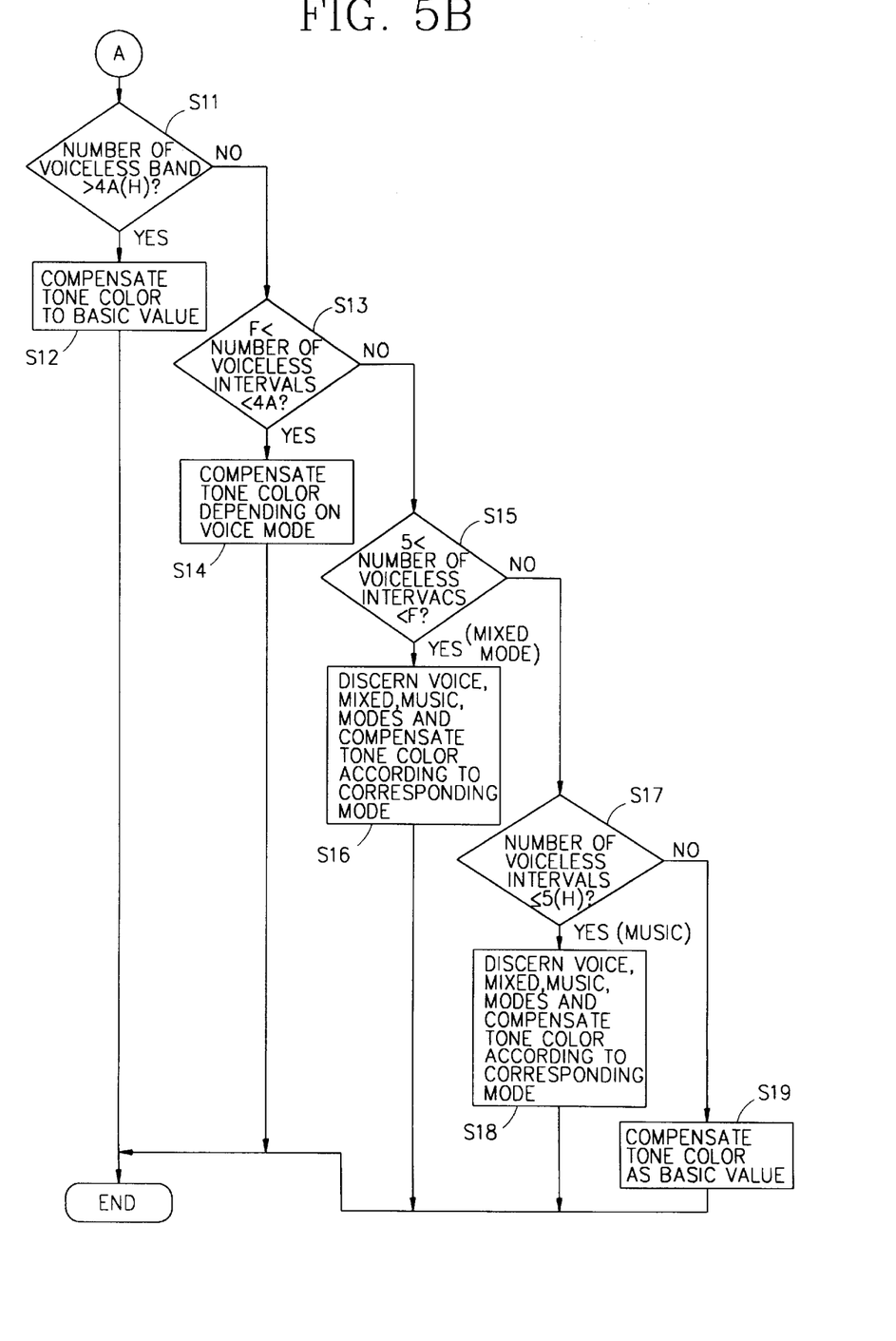

FIGS. 5A and 5B are signal flow charts respectively illustrating the method for automatically compensating tone color according to the present invention.

First, as shown therein, it is checked whether the input mode key, that is, the channel modification key is inputted by a user or the voice input signal modification key is inputted so as to carry out a compensation routine of the tone color mode instantly. When the key is not inputted, the tone color mode compensation routine is performed after waiting for a predetermined time so as to consider the different frequency characteristics within the identical mode.

When the automatic tone color compensation routine is initiated, respective variables which are employed to compensate tone color are initialized. Then, it is checked whether the preset time T1 (200 ms) previously set has lapsed. If the time has not lapsed, the output value of respective bands of the 7-band pass filter 205A is sequentially read through a multiplexer after wasting until the time lapses. Then, an average value with regard to the previous value is obtained and stored. (steps S1~S4)

Then, it is checked whether the previously set time T2 (15 ms) has lapsed. If the time has not lapsed, the steps S3, S4 are repeatedly carried out; if the time has lapsed, the digital value stored thus far is converted to an analog value and the value is compared with the reference value (for example 30 (h)) previously set. (steps S5~S7)

According to the compared results, when it turns out that the analog value is less than the reference value, the present interval is determined as voiceless to thereby increase the number of voiceless frames by "1". Then, the number of the thus far voiceless frames is checked and when a predetermined number of times (for example, 9 times) has not reached, the steps S5~S8 are repeatedly carried out.

However, with the checked results, when the number of the voiceless intervals has surpassed the predetermined number of times, the present packet number is confirmed (step S10). When the previously set value (packet=9) is not reached, it is restored to the second step S2. When it has reached, the tone color mode is discerned on the ground of the thus far obtained frequency characteristics, that is, the frequency energy of the audio signal according to the tone color mode to thereby compensate the tone color.

When the number of the voiceless intervals is less than 4 A(h), it is determined that the present tone color mode is determined as numberless, thereby compensating the tone color as basic value (steps S11, S12).

When F(h)<number of voiceless intervals≦4 A(h) is satisfied, the present tone color is determined as voice, and the tone color compensation is carried out accordingly (steps S13, S14).

Also, when 5 (h)<number of voiceless intervals≦F(h) is satisfied, the present tone color id determined as mixed, and then voice, music and mixed are discerned according to the number of the energy bands, thereby carrying out the tone color compensation according to the corresponding mode (steps S15, S16).

If number of voiceless intervals≦5 (h) is satisfied, the present tone color id determined as music, and then voice, music and mixed are discerned according to the number of the energy bands, thereby carrying out the tone color compensation according to the corresponding mode (steps S17, S18).

When the number of voiceless intervals corresponds to cases other than the above, the tone color is compensated as basic value (step S19).

As described above, the present invention automatically adjust a tone color by determining a present tone color in itself on the ground of the frequency energy being presently applied when a channel is modified, an input audio signal is switched, or a color sound mode is modified, thereby eliminating a manual manipulation by a user as well as providing an optimal sound.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A method for automatically compensating a tone color, comprising:

a first step for determining whether a channel is modified or an input audio signal is switched;

a second step for calculating frequency characteristics of the input audio signal and comparing the compared result with data in a basic table;

a third step for determining the input audio signal as a least error mode during the second step; and a fourth step for compensating a tone color in accordance with the determined mode.

2. The method of claim 1, wherein the first step includes a step at which the first step proceeds to the second step after waiting until a predetermined time lapses so as to consider other frequency characteristics within an identical tone color mode.

3. The method of claim 1, wherein the second step further comprises a step at which energy values and variations of respective bands with regard to the audio signal are periodically read and accumulated for a predetermined time, and a frequency characteristic is calculated on the ground of the accumulated value.

4. The method of claim 1, wherein the third step determines a preference rank of characteristics of the audio signal on the ground of the accumulated value of energy with retard to respective frequency bands in correspondence to a time lapse, and a mode is determined by the preference rank.

5. In a device for receiving an external input or an aerial wave and playing back an audio signal, an apparatus for automatically compensating a tone color, comprising:

an automatic tone color determining unit for analyzing characteristics depending upon time-oriented frequency types;

a microcomputer for determining a tone color mode using tone color determining information outputted from the automatic tone color determining unit and outputting a tone color compensating control signal so as to compensate the tone color to a corresponding mode thereof; and a voice control unit for compensating a tone color in accordance with the tone color compensating control signal.

6. The apparatus of claim 5, wherein the automatic tone color determining unit comprises:

a multi-band pass filter for classifying a frequency of the input audio signal to a multi-band frequency and outputting the classified value; and a signal interpreter for accumulating an output value of the multi-band pass filter for a predetermined time, calculating energy values and variations with regard to respective bands according to frequency characteristics, comparing the calculated result with data in a basic table, discerning the input audio signal to a least error mode, and outputting a tone color determining information accordingly.

7. The apparatus of claim 6, wherein the multi-band pass filter is a 7-band pass filter.

* * * * *